(12) United States Patent
Schwarz et al.

(10) Patent No.: US 8,585,257 B2
(45) Date of Patent: Nov. 19, 2013

(54) COMPACT HOUSING

(75) Inventors: Thomas Schwarz, Regensburg (DE); Ulrich Steegmüller, Regensburg (DE); Michael Kühnelt, Regensburg (DE); Roland Schulz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 447 days.

(21) Appl. No.: 12/809,694

(22) PCT Filed: Nov. 24, 2008

(86) PCT No.: PCT/DE2008/001954
§ 371 (c)(1),
(2), (4) Date: Nov. 2, 2010

(87) PCT Pub. No.: WO2009/079970
PCT Pub. Date: Jul. 2, 2009

(65) Prior Publication Data
US 2011/0280025 A1    Nov. 17, 2011

(30) Foreign Application Priority Data
Dec. 21, 2007  (DE) .......................... 10 2007 062 047

(51) Int. Cl.
*B60Q 1/06* (2006.01)
(52) U.S. Cl.
USPC ............................ 362/373; 362/362; 362/375
(58) Field of Classification Search
USPC ......................................... 362/373, 362, 375
See application file for complete search history.

(56) References Cited

U.S. PATENT DOCUMENTS

| 4,740,982 A | 4/1988 | Hakuta et al. |
| 4,845,344 A | 7/1989 | Price et al. |
| 5,005,939 A | 4/1991 | Arvanitakis et al. |
| 5,195,102 A | 3/1993 | McLean et al. |

(Continued)

FOREIGN PATENT DOCUMENTS

| DE | 36 32 995 | 4/1987 |
| DE | 42 29 462 | 3/1993 |

(Continued)

OTHER PUBLICATIONS www.coherent.com/downloads/sapphire_bochüre.pdf, Apr. 9, 2009 (HBA): Ausdruck liegt in Entgegenhaltungslasche.
www.oled-display.info/what-is-necsel-technology, Apr. 9, 2009 (HBA): Ausdruck liegt in Entgegenhaltungslasche.

*Primary Examiner* — Evan Dzierzynski
(74) *Attorney, Agent, or Firm* — Cozen O'Connor (57) ABSTRACT

A compact housing comprises a one-piece mounting plate made from a metallic material, which is designed to be joined thermally conductively by a main side to an external support not belonging to the compact housing. Furthermore, the compact housing comprises a one-piece housing cover, which is joined permanently to the mounting plate and therewith encloses a volume. In addition, the compact housing contains at least one electrical feedthrough, such that at least one electrically conductive connection may be produced therewith from inside the volume to outside the volume, this connection being insulated electrically from the mounting plate. Within the volume a module is located which is designed to emit electromagnetic radiation. This module is applied directly to the mounting plate, such that the joint face between mounting plate and module is substantially parallel to the main side of the mounting plate joined to the external support.

7 Claims, 6 Drawing Sheets

(56) References Cited

U.S. PATENT DOCUMENTS

| | | | |
|---|---|---|---|
| 5,758,951 | A | 6/1998 | Haitz |
| 6,072,815 | A | 6/2000 | Peterson |
| 6,422,766 | B1* | 7/2002 | Althaus et al. ............ 385/94 |
| 7,217,314 | B2* | 5/2007 | DeGuiseppi et al. ...... 95/117 |
| 2004/0113276 | A1 | 6/2004 | Hennig et al. |
| 2006/0029114 | A1 | 2/2006 | Kohda et al. |
| 2006/0164817 | A1 | 7/2006 | Yoshida |
| 2006/0262544 | A1* | 11/2006 | Piepgras et al. ........... 362/373 |
| 2007/0091945 | A1 | 4/2007 | Ferstl |
| 2007/0115666 | A1* | 5/2007 | Thomas et al. ............ 362/294 |
| 2007/0201232 | A1* | 8/2007 | Chen ........................ 362/294 |
| 2009/0225797 | A1 | 9/2009 | Kuhnelt et al. |
| 2009/0246898 | A1 | 10/2009 | Steegmuller et al. |

FOREIGN PATENT DOCUMENTS

| | | |
|---|---|---|
| DE | 198 23 691 | 12/1999 |
| DE | 102 29 712 | 1/2004 |
| DE | 10 2004 050 118 | 3/2006 |
| DE | 10 2005 036 266 | 1/2007 |
| DE | 10 2006 017 293 | 7/2007 |
| DE | 10 2006 017 294 | 7/2007 |
| DE | 10 2007 001 667 | 11/2007 |
| EP | 1 126 526 | 8/2001 |
| EP | 1 301 061 | 5/2002 |
| EP | 1 241 752 | 9/2002 |
| JP | 2003-133629 | 5/2009 |
| WO | WO 96/34434 | 10/1996 |
| WO | WO 01/43167 | 6/2001 |

* cited by examiner

COMPACT HOUSING

RELATED APPLICATIONS

This is a U.S. national stage of application No. PCT/DE2008/00954, filed on Nov. 24, 2008.

This patent application claims priority from German patent application no. 10 2007 062 047.2 filed Dec. 21, 2007, the disclosure content of which is hereby incorporated by reference.

FIELD OF THE INVENTION

The invention relates to a compact housing with a mounting plate, a housing cover, an electrical feedthrough and a module emitting electromagnetic radiation.

BACKGROUND OF THE INVENTION

Light from compact sources is currently used in lighting elements for displays and also for projection applications. The smallest possible sources with the highest possible luminous intensities are desired. These result in large power densities per given source volume. Efficiency being finite, waste heat always arises during operation of such a light source. This waste heat has to be dissipated for example by way of the housing of the light source. Due to their excellent characteristics such as for instance good collimatability, use of lasers in lighting sources is very widespread. Semiconductor lasers or solid-state lasers pumped with semiconductor elements are widely used due to their frequently compact structure and ease of handling. If different-coloured laser light sources, in particular red, green and blue, are combined, "RGB modules" appropriate for many applications may also be produced. With RGB modules a plurality of colour impressions may also be generated, inter alia also white light. Laser light sources generally make higher demands as regards the temperature control or temperature stability of their housing than other light sources. Lasers are also often sensitive to moisture, dust or mechanical impact, and moreover require a stable platform for instance for the mounting of optical systems or other components such as electronic circuits. The space requirement for the light source needs to be small in such cases, in order to ensure a versatile range of uses. Despite these complex requirements, the manufacturing costs for a light source need to be as low as possible, which means inter alia that the structure of the source needs to be as simple as possible.

SUMMARY OF THE INVENTION

One object of the invention is to provide a compact housing with a module emitting electromagnetic radiation, wherein the module located in the compact housing is provided with improved protection by simple means.

This and other objects are attained in accordance with one aspect of the present invention directed to a compact housing that comprises a one-piece mounting plate made from a metallic material, which is designed to be joined thermally conductively by a main side to an external support not belonging to the compact housing. Furthermore, the compact housing comprises a one-piece housing cover, which is joined permanently to the mounting plate and therewith encloses a volume. In addition, the compact housing contains at least one electrical feedthrough, such that at least one electrically conductive connection may be produced therewith from inside the volume to outside the volume, this connection being insulated electrically from the mounting plate. Within the volume a module is located which is designed to emit electromagnetic radiation. This module is applied directly to the mounting plate, such that the joint face between mounting plate and module is substantially, i.e. within manufacturing tolerances, parallel to the main side of the mounting plate joined to the external support. Such a compact housing is of simple construction, may be produced cost-effectively, provides the module with good protection against moisture, for instance, and allows efficient dissipation of waste heat in the case of a compact housing with small geometric dimensions.

It is not necessary for the volume to be wholly or solely enclosed by the mounting plate and the housing cover.

The fact that the module is arranged parallel to the main side of the mounting plate may mean that the radiation produced by the module has a beam axis on leaving the module which, within manufacturing tolerances, is oriented parallel to the main side of the mounting plate. It is also possible for the largest defining face of the module to face the main side of the mounting plate.

If the module emitting electromagnetic radiation is a laser module, the radiation emitted by the module is easy to handle, in particular the radiation is easy to collimate and easy to focus. High light intensities may also be achieved.

If light-emitting modules are used which emit red and/or green and/or blue light, a projection means or indeed a lighting means for a display may be obtained. In particular, an "RGB light source" may be formed. By mixing red, green and blue light, it is also possible to produce a plurality of colour impressions.

By configuring the mounting plate with a metal core board, conductive tracks or electrical conductors may easily be created thereon.

An adhesive bond is easy to produce between housing cover and mounting plate. In addition an electrically insulating adhesive material may be used, such that any exposed conductive tracks which may have been applied to the metal core board are not short-circuited by the adhesive material. Unevennesses for example of the board in the regions to be adhesively bonded may also be compensated by the glue.

By using a glue comprising a silicone or an epoxy resin to form the adhesive bond, it is in particular possible to produce adhesive bonds which are impermeable to gas. In particular, the diffusion of water vapour through the adhesive bond may be greatly restricted.

Three-dimensional structuring of the mounting plate increases the design latitude thereof. In particular, holding, mounting and/or cooling elements may be formed, which make it possible for instance to secure optical systems directly on the mounting plate without for example additional mirror supports. Such three-dimensionally structured mounting plates may be straightforwardly produced using methods such as Metal Injection Melting, also known as MIM, milling or die casting.

If mounting plate and housing cover are made from the same material, manufacturing complexity is reduced. In particular, the two parts may be joined together without great effort.

If the housing cover is made from a material which is transparent at least in a range of the spectrum in which the module emits electromagnetic radiation, the emitted radiation may be easily coupled out of the compact housing.

The electrical feedthrough from inside to outside the sealed volume is easy to produce using conductive tracks located on a metal core board. In particular, the housing cover may be adhesively bonded to the metal core board without the for example etched conductive tracks being disturbed or damaged by the adhesive bond. This reduces manufacturing costs.

If the electrical feedthrough is made from a multilayer ceramic, it is possible to achieve extremely gas-tight sealing of the volume because the multilayer ceramic may be soldered in.

If the electrical feedthrough is formed with a flexible printed circuit board, which conventionally comprises a thin core of polyimide, which is coated with copper structures and may also be of multilayer construction, extremely gas-tight sealing of the volume may again be achieved. The mechanical flexibility makes the conductor arrangement easier to handle. A flexible printed circuit board may also be inexpensively produced.

By sealing the volume gas-tightly the module is protected from environmental influences, in particular from water and water vapour. Service life is increased, in particular in the case of moisture-sensitive laser and semiconductor modules.

A bond between housing cover and mounting plate which takes the form of a soldered and/or welded joint is simple, efficient and gas-tight.

Fitting at least one driver electronics unit for the light-emitting module on the mounting plate allows a compact and space-saving arrangement to be achieved.

If the driver electronics unit is situated inside the volume, it is likewise protected from environmental influences and is moreover in spacial proximity to the module.

If the compact housing comprises a connecting means located outside the volume, the compact housing may be connected without great effort to external supply conductors not belonging to the compact housing.

If the connecting means is made of a plastics/metal plug connector element or a zero force plug connector, the connecting means is inexpensive and easy to fit.

If the compact housing comprises at least one electrical conductor, which produces at least one electrical connection between module and feedthrough and/or driver electronics unit and/or connecting means, space-saving electrical contacting may be straightforwardly brought about between these components.

If the electrical conductors are provided by means of a flexible printed circuit board or consist of such a board, the effort required in guiding the electrical conductors is reduced, since the latter may very largely be freely displaced in the volume in an efficient manner for instance by bending.

If the compact housing is configured such that it is suitable for the use of high frequency driver currents for the module, the number of possible applications thereof is increased. High frequency may mean that the driver currents may be tuned to a frequency of at least 20 MHz, in particular of at least 40 MHz. In particular, in this way "flying spot" projections may be achieved, for which switched-mode driver currents typically of the order of magnitude of 20 MHz to 100 MHz are required.

A light source which requires little space but at the same time is highly luminous is obtained if the compact housing can be operated at elevated driver currents of up to 12 A. In particular, the driver currents at least occasionally achieve or exceed an intensity of 6 A, in particular of 10 A.

If the compact housing comprises a one-piece, thermally conductive, in particular metallic base plate, which is fitted between the mounting plate and an external support not belonging to the compact housing, the design latitude of the compact housing is increased. Such a base plate may also be used as an adapter plate, in order to be able to fit the same type of mounting plate on differently configured external supports.

If the base plate is three-dimensionally structured, such that holding, mounting and/or cooling elements are formed, these elements may be efficiently and inexpensively incorporated into the compact housing.

The temperature of the module emitting electromagnetic radiation may be adjusted by means of a temperature control unit, which the compact housing comprises. In this way, for instance, overheating of the module is prevented or indeed, in particular in the case of semiconductor laser modules, spectral shifting of the emitted radiation is prevented or indeed allowed in a purposeful manner.

If the temperature control unit is provided with a Peltier element, it may be fitted in a space-saving, cost-effective manner. Furthermore, the temperature control unit is electrically operable and precisely and simply adjustable.

By thermally conductive application of the cold side of the Peltier element to the mounting plate and of the hot side to the base plate, the hot and cold sides of the Peltier element may be thermally decoupled effectively and efficient outward dissipation of the heat loss of the Peltier element to an external support not belonging to the compact housing may be ensured, without a negative effect on the temperature control of the module.

If permanent joining of housing cover and mounting plate is effected indirectly by way of the base plate and Peltier element, the number of possible configuration operations for the compact housing is increased. In particular, if the housing cover is fitted thermally conductively to the side of the base plate which is joined to the hot side of the Peltier element, the area of the compact housing releasing heat to the outside becomes larger, so making cooling more efficient.

If the compact housing has a light outlet window, which is transparent with regard to at least some of the electromagnetic radiation emitted by the module, the light may leave the compact housing. This applies in particular if the housing cover is made of metal. The light outlet window comprises for example $SiO_2$, a glass, a plastics material or sapphire or consists of at least one of the stated materials.

If the light outlet window is heated, water or water vapour may be prevented from being deposited on the light outlet window and hindering outlet of the light from the compact housing. This applies in particular when the light outlet window is in thermal contact with the cold side of a Peltier element.

If the light outlet window is configured such that it has an optically diffractive, refractive or filtering action on at least some of the radiation emitted by a module located in the volume, the number of optical components to be fitted on the mounting plate may be reduced. This also reduces the amount of space needed by the compact housing.

Any moisture which may penetrate into the volume may be kept away from the module by way of a moisture trap in the volume.

The moisture trap may contain a hydrophilic or water-attracting substance, such as for instance a zeolite or a calcium or barium oxide. It is likewise possible to configure the moisture trap as a cold trap.

BRIEF DESCRIPTION OF THE DRAWINGS

The invention is described below by way of exemplary embodiments with reference to the drawings. Elements which are the same in the individual Figures are indicated with the same reference numerals. The features shown on the drawings are not to scale relative to one another, however.

In the drawings.

DETAILED DESCRIPTION OF THE DRAWINGS

Figure 1:
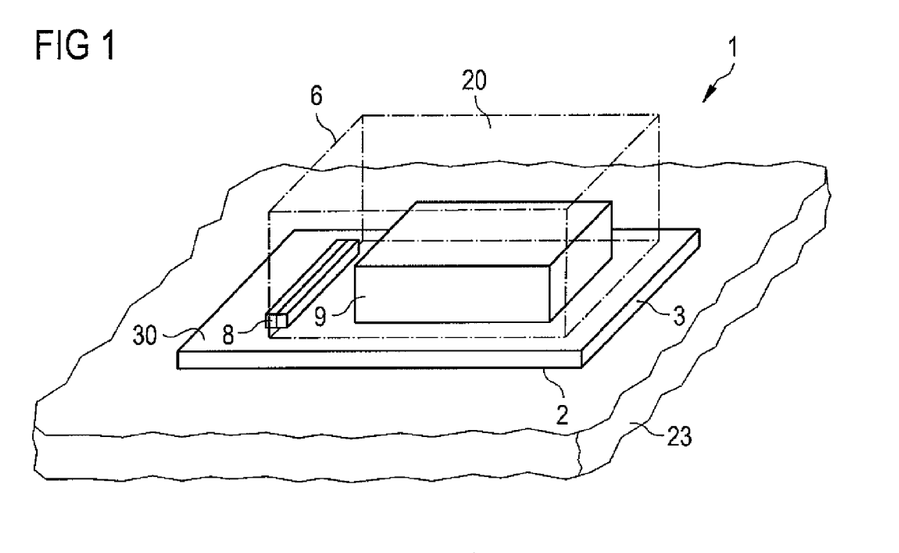
FIG. 1 is a schematic representation of an exemplary embodiment of a compact housing.

FIG. 1 shows an exemplary embodiment of a compact housing 1. A metallic, thermally conductive mounting plate 3 is substantially flat and rectangular in shape. Examples of materials with high thermal conductivity which may be used for the mounting plate 3 are copper, aluminium, CuW or MoCu. A main side 2 of the mounting plate 3 is joined thermally conductively to an external support 23, which is not a component of the compact housing 1. On the opposite side of mounting plate 3 from the main side 2 there is located a mounting side 30. Main side 2 and mounting side 30 are substantially parallel to one another. A housing cover 6 is mounted on the mounting side 30 by way of a soldered joint. Housing cover 6 and mounting plate 3 enclose a volume 20. The housing cover 6 is transparent in this exemplary embodiment. In the volume 20 there is located a module 9 which emits electromagnetic radiation, which module is joined thermally conductively directly to the mounting side 30 of the mounting plate 3. Also mounted on the mounting side 30 is an electrical feedthrough 8. The electrical feedthrough is situated between housing cover 6 and mounting plate 3 and is soldered around thereto, in a plane perpendicular to the mounting side 30, such that the volume 20 is sealed in gas-tight manner. In the region of the feedthrough 8 the housing cover 6 thus does not have any direct contact with the mounting plate 3.

Figure 2:
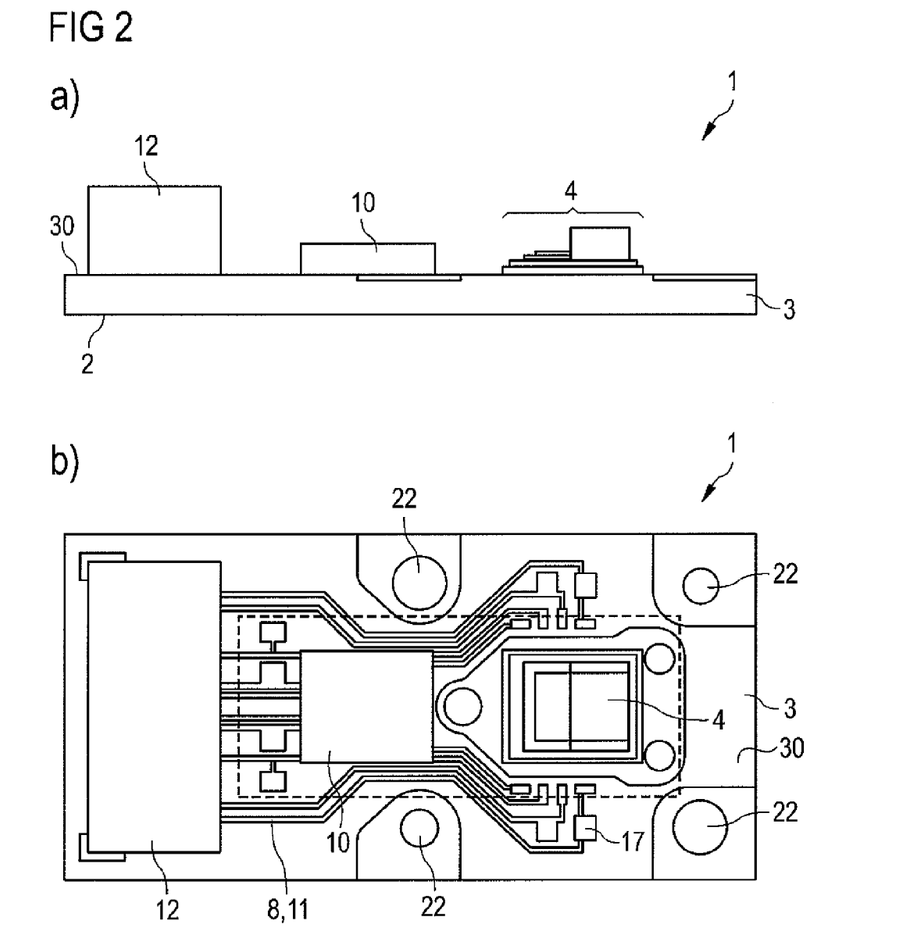
FIG. 2 shows a side view a) and a plan view b) of a compact housing, the mounting plate taking the form of a metal core board.

FIG. 2 shows a further schematic representation of an exemplary embodiment of a compact housing 1. To simplify the illustration, the housing cover 6 has not been shown here. The line along which the housing cover 6 is joined to the mounting plate 3 is shown as a broken line. The substantially flat, planar mounting plate 3 is made from a metal core board. The metal core board comprises a metallic core, which is a few millimeters thick and is sheathed in a thin polyimide layer. A layer of copper is applied to this polyimide sheath, which may be used for producing electrical conductors 11 for example using etching processes, as with a conventional printed circuit board. The metal core board therefore combines on the one hand ease of production with regard to the conductors 11 with high thermal conductivity owing to the metal core. Since the polyimide layer is very thin, typically below 100 micrometers, it does not represent significant thermal resistance. Nevertheless, in regions in which the module 9, which here takes the form of laser module 4, is joined to the mounting plate 3, the polyimide layer has been removed from the mounting side 30, in order to bring about direct contact with the metal core of the board.

In addition to the laser module 4, a driver electronics unit 10 and an electrical connecting means 12 have also been mounted on the mounting side 30. The electrical conductors 11 situated on the mounting side 30 are structured such that they bring about suitable electrical connections between connecting means 12, driver electronics unit 10 and laser module 4. In addition, solder pads 17 are provided on the conductive tracks, in order to allow further contacting, for instance to the side of the laser module 4 remote from the mounting side 30. The electrical conductors 11 at the same time form the electrical feedthrough 8, since, as a result of the very small height of the electrical conductors 11 on the mounting side 30, the housing cover 6 may be simply adhesively bonded to the mounting side 30 by way of an electrically insulating adhesive.

The electrical connecting means 12 takes the form of a metal/plastics plug connector, which is a widely used component in electronics and is inexpensive. In addition, simple contacting of this connecting means 12 with external supply conductors not shown here is possible. So as to be able to fasten the compact housing 1 to an external support, not shown, fastening devices 22 in the form of drill holes have been provided on the mounting plate 3, by means of which devices the compact housing 1 may be screwed to an external support. Without restriction to other exemplary embodiments of the invention, the size of the compact housing 1 according to FIG. 2, amounts, as in the other exemplary embodiments, laterally to less than 30 by 30 millimeters, while the height amounts to a few millimeters.

Figure 3:
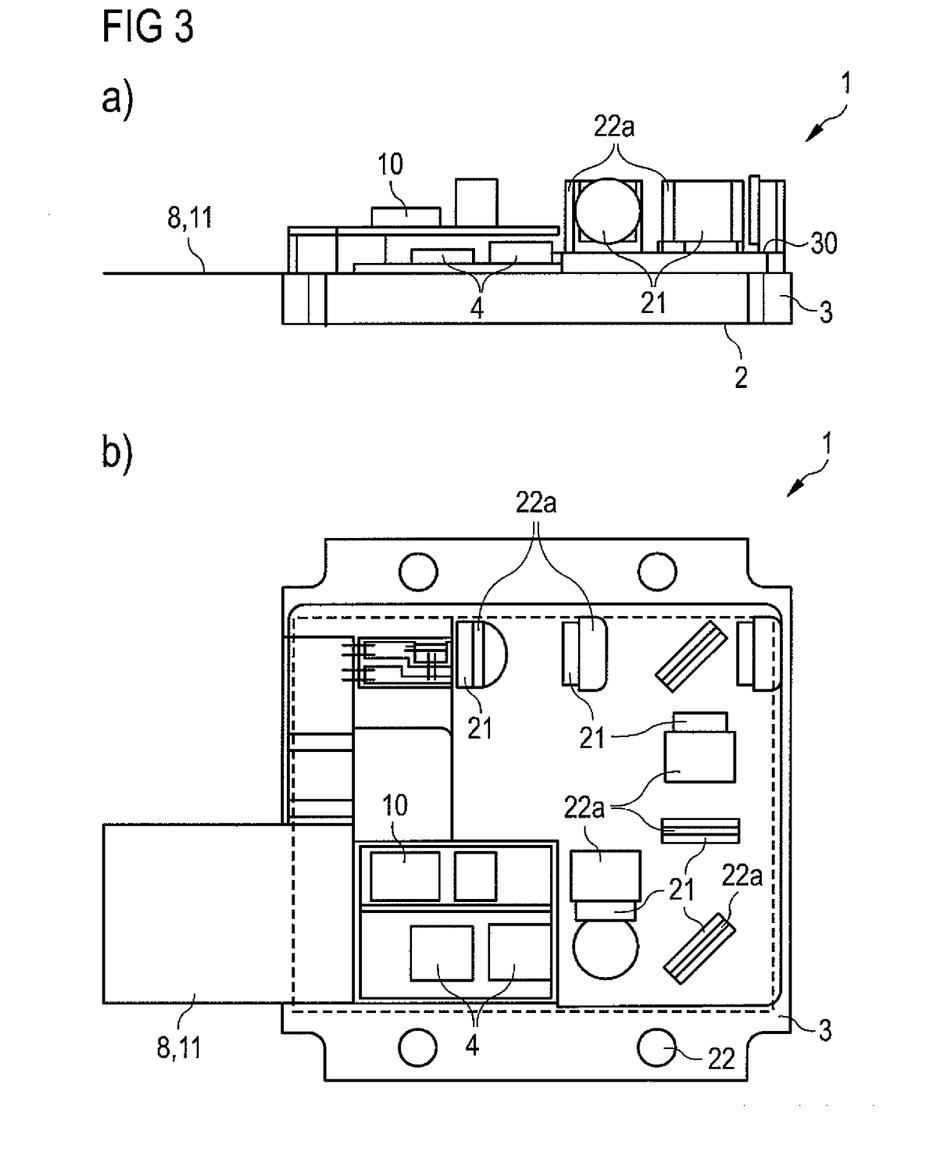
FIG. 3 shows a side view a) and a plan view b) of a compact housing, the mounting plate taking the form of a metallic plate provided with three-dimensional structures.

In the exemplary embodiment according to FIG. 3 the housing cover 6 is again not shown for reasons of clarity, and the joint with the mounting plate 3 is again indicated as a broken line. The beam paths of the module 4 emitting laser light are symbolised as dash-dotted lines. The one-piece mounting plate 3 made from a metallic material and exhibiting high thermal conductivity is provided with more complex three-dimensional structuring. By means of this structuring fastening means 22a for example for optical components 21 such as lenses, filters or mirrors are formed, such that these components may be fitted directly on the mounting plate 3 already preadjusted by way of the shaping of said mounting plate 3. There is also once again the possibility of screwing the mounting plate 3 to an external support by way of fastening means 22 provided therefor. The compact housing 1 also comprises a driver electronics unit 10, which is located inside the volume 20 enclosed by mounting plate 3 and housing cover 6. Electrical conductors 11 and electrical feedthroughs 8 are formed from a flexible printed circuit board. The flexible printed circuit board consists of a flat strip typically of polyimide, which is around 100 micrometers thick. Conductive structures for instance of copper are mounted on this polyimide strip. These copper tracks may be covered by solder resist or indeed by a further layer of polyimide. A structure of the flexible printed circuit board is also possible which comprises a plurality of copper and polyimide layers. To obtain a gas-tight housing, it is likewise possible to use flexible printed circuit boards which comprise in the regions necessary therefor a continuous solderable copper layer in the form of an outer jacket, which copper layer may be soldered or welded to the mounting plate 3 or housing cover 6.

Three-dimensionally structured mounting plates 3 may be produced with relatively little effort using methods such as Metal Injection Melting, MIM for short, milling or die casting. The three-dimensional structuring saves the fitting of additional components such as for instance mirror supports or lenses. At the same time, the fastening devices may be structured such that complex adjustment of the optical components is very largely dispensed with, since these components have already been suitably positioned on the mounting plate 3. Apertures or limit stops for instance may also be co-structured, which likewise simplifies adjustment of the optical systems. Unlike as is shown in FIG. 3, the electrical feedthrough 8 does not have to be situated between mounting plate 3 and housing cover 6, but rather may for example be fitted in a recess in the housing cover 6.

In the exemplary embodiment according to FIG. 4, which again comprises a light-emitting module 9, a mounting plate 3 and a flat, planar housing cover 6 of simple geometry, the mounting plate 3 is provided with cooling ribs. This simplifies dissipation of the operational heat from the module 9 to the outside and saves on more complex cooling devices. To couple the light out of the compact housing 1, a light outlet window 7 is incorporated therein.

Figure 4:
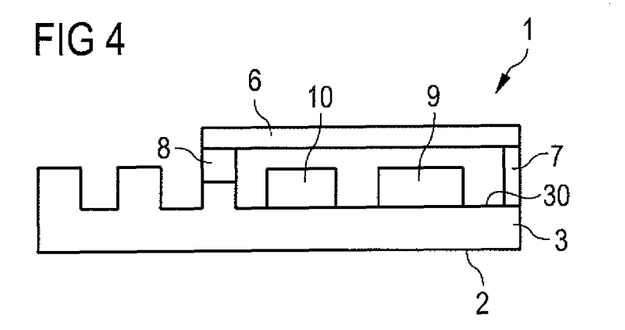
FIG. 4 shows a side view of a further exemplary embodiment of a compact housing.

Optionally the light outlet window 7 may at the same time be used as an optical component, for instance as a focusing or defocusing element, or may, if for instance provided with a dielectric or absorbent layer, also act as a filter.

Depending on requirements, a plurality of possibly differently functionalised light outlet windows 7 may also be used. By way of suitable beam guidance inside the compact housing 1 or by way of suitable driver electronics 10 it is also possible to make alternate use of different light outlet windows 7 for coupling light out of the compact housing 1, for instance to achieve different light intensities, beam positions or colour schemes.

Figure 5:
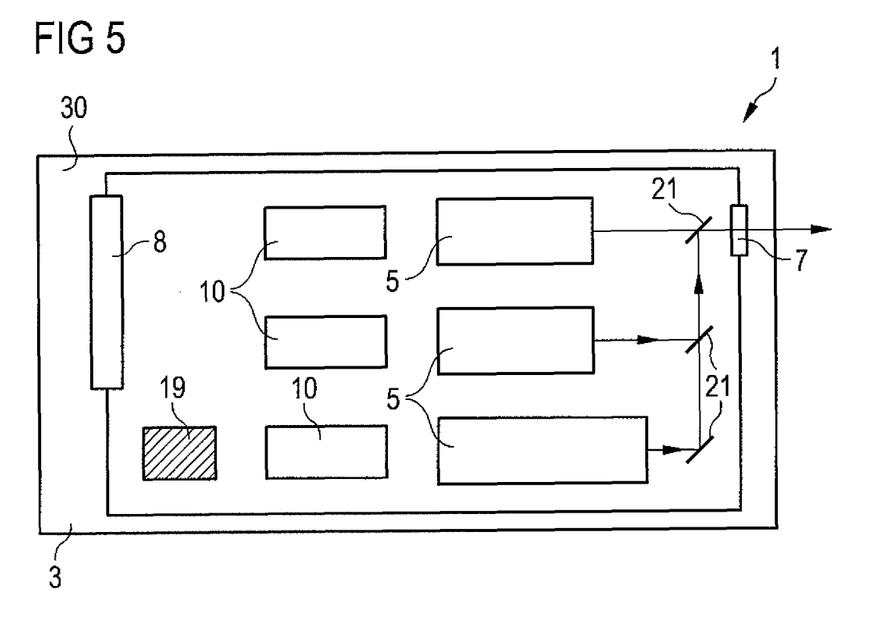
FIG. 5 shows a plan view of an exemplary embodiment with a plurality of modules and with a moisture trap.

An exemplary embodiment with a plurality of emitting modules is shown schematically in FIG. 5. Once again, the housing cover 6 has not been shown. Laser modules and optical systems are shown in simplified manner as a unit 5. The three units 5 may for instance emit red, green and blue light and thereby result overall in an "RGB module", which may be used for instance for projection applications. The light from the three units 5, symbolised by lines with arrows, is combined and leaves the compact housing 1 via a light outlet window 7. The driver electronics units 10 belonging to the units 5 are accommodated in the volume 20 of the compact housing 1. A moisture trap 19 is likewise incorporated in the volume 20. This prevents moisture from collecting at the water-sensitive units 5 if for instance the joint between mounting plate 3 and housing cover 6 acquires a leak, it being deposited instead in the moisture trap. The moisture trap may contain a desiccant such as for instance a zeolite. It is possible to configure the housing cover 6 such that a simple exchange or renewal of the desiccant is possible for instance via an orifice with a gas-tight screw closure.

If the compact housing 1 is suitably configured, in particular if the housing cover 6 is joined electrically conductively to the mounting plate 3 and electronic shielding is thereby produced, a compact housing 1 suitable for high frequencies may be obtained. For projection applications switched-mode driver currents with clock frequencies in the range from 20 to 100 Megahertz are for instance needed. This high frequency suitability may be obtained by impedance-matched current supply with suitably configured flexible conductive tracks, which form electrical conductors 11, in combination with "zero force plug connectors" as connecting means 12. If use as display lighting is intended, in which the red, yellow or blue light fractions of the light emitted by the units 5 are filtered through a mask and generally high light intensities and thus electrical power densities are needed, it is also possible, by way of suitably configured flexible printed circuit boards forming the conductors 11, to carry very high drive currents in the range of up to twelve amps with low loss and thus to use electrical currents of this magnitude.

Figure 6:
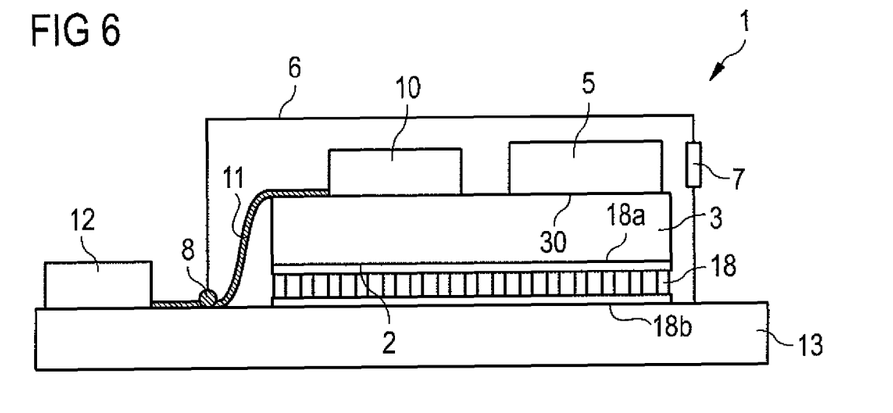
FIG. 6 shows a side view of an exemplary embodiment with a Peltier element and a base plate.

FIG. 6 shows a compact housing 1 which comprises a temperature control unit 16 in the form of a Peltier element 18. The cold side 18a of the Peltier element 18 is joined to the mounting plate 3, the hot side 18b to the base plate 13. This makes it possible for the unit 5 situated on the mounting side 30 and consisting of laser module and optical systems to be kept constantly at a suitable temperature. The temperature of the driver electronics unit 10 may also be co-controlled. The housing cover 6 is soldered to the base plate 13. The electrical feedthrough 8 takes the form of a flexible conductive track, as in the exemplary embodiment according to FIG. 3. The connecting means 12 to external conductors, not shown, take the form of metal/plastics plug connectors. Since the housing cover 6 is joined to the hot side 18b of the Peltier element 18 by way of the base plate 13, the temperature of the housing cover 6 is elevated in comparison to the surrounding environment, to the mounting plate 3 and the components located on the mounting side 30, such that no moisture is deposited on the light outlet window 7 and the light can leave the compact housing 1 unimpaired.

Figure 7:
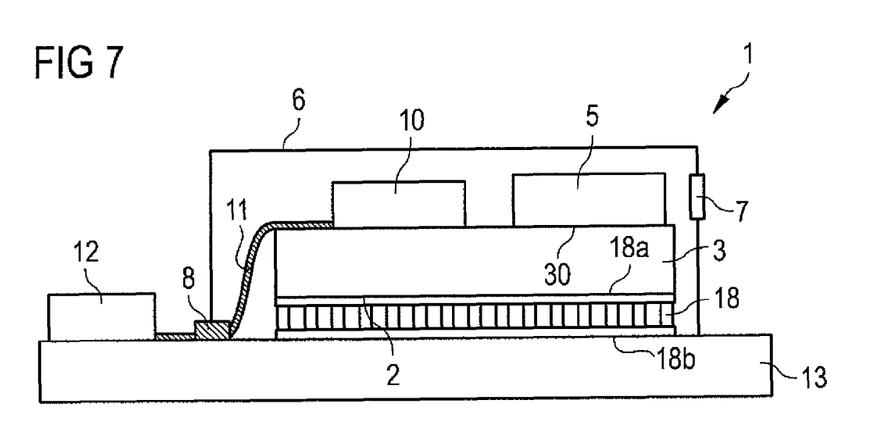
FIG. 7 shows a side view of an exemplary embodiment with a multi-layer ceramic as electrical feedthrough.

The exemplary embodiment according to FIG. 7 corresponds to that according to FIG. 6. The electrical feedthrough 8 here takes the form of a multilayer ceramic, however. Electrical vias of for example copper are in this case embedded in a ceramic substance such as for instance aluminium nitride. A plurality of alternate layers of ceramic and copper may be provided. The overall component is produced by sintering. By means of an outer coating of for instance copper, the multilayer ceramic may be soldered or welded in all around, as in the exemplary embodiment according to FIG. 1, such that overall an extremely gas-tight electrical feedthrough is obtained.

Figure 8:
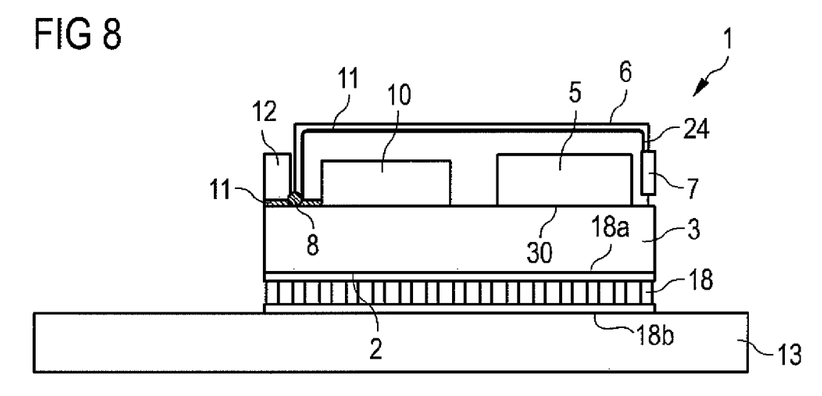
FIG. 8 shows an exemplary embodiment with a heated light outlet window.

According to FIG. 8 the housing cover 6 is mounted on the mounting plate 3, which is in thermal contact with the cold side 18a of the Peltier element 18. In this way, the temperature of the housing cover 6 is likewise lowered in comparison to the surrounding environment, such that the light outlet window 7, which is fitted on the housing cover 6 and is thus likewise relatively cold, may mist up. To prevent this, the light outlet window 7 is heated by guiding a flexible conductor 11 to a heating resistor located at the light outlet window 7.

It goes without saying that the various variant configurations of the electrical feedthroughs 8, of the positioning of the driver electronics 10, of the electrical conductors 11 and of the shape of the mounting plate 3, as shown in the various exemplary embodiments, may be combined with one another. The number of for example light-emitting modules 9, Peltier elements 18 or moisture traps 19 which the compact housing 1 comprises may also differ from that in the exemplary embodiments shown.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A compact housing comprising:
   a one-piece mounting plate made from a metallic material and configured to be joined thermally conductively by a main side to an external support;
   a one-piece housing cover which is joined permanently to the one-piece mounting plate and which encloses a volume therewith;

at least one electrical feedthrough with which at least one electrically conductive connection is produced from inside the enclosed volume to outside the enclosed volume, the at least one electrically conductive connection being insulated electrically from the one-piece mounting plate; and at least one module located in the enclosed volume which is configured so as to emit electromagnetic radiation and which is mounted directly on the one-piece mounting plate parallel to the main side;

wherein the at least one module is a laser module that emits red, green and blue light;

wherein at least one driver electronics unit for the at least one module is mounted on the one-piece mounting plate and is located inside the enclosed volume;

wherein the at least one electrical feedthrough and an electrical conductor are formed from a flexible printed circuit board, said electrical conductor producing an electrical connection between the at least one electrical feedthrough, the at least one driver electronics and the at least one module;

wherein the one-piece mounting plate and the one-piece housing cover consist of a same material;

wherein the flexible printed circuit board comprises a continuous solderable copper layer formed as an outer jacket, the continuous solderable copper layer being soldered or welded to the one-piece mounting plate and to the one-piece housing cover; and wherein the red, green and blue light are mixed to produce a plurality of different color impressions.

2. The compact housing according to claim 1, wherein an adhesive bond is formed between the one-piece housing cover and the one-piece mounting plate.

3. The compact housing according to claim 1, wherein the one-piece mounting plate is three-dimensionally structured, such that at least one of holding, mounting and cooling elements are formed.

4. The compact housing according to claim 1, wherein the enclosed volume is sealed in a gas-tight manner.

5. The compact housing according to claim 1, further comprising:
   a one-piece, thermally conductive metallic base plate mounted between the one-piece mounting plate and the external support;
   wherein the one-piece, thermally conductive metallic base plate comprises at least one instance of three-dimensional structuring, such that at least one of holding, mounting and cooling elements are formed.

6. The compact housing according to claim 1, further comprising:
   at least one light outlet window formed of a solid, the at least one light outlet window being transparent at least to some radiation emitted by the at least one module, the at least one light outlet window being heated.

7. The compact housing according to claim 1, wherein a moisture trap is located in the enclosed volume; and wherein the moisture trap one of contains a hydrophilic substance and is formed as a cold trap.

* * * * *

UNITED STATES PATENT AND TRADEMARK OFFICE
CERTIFICATE OF CORRECTION

| | | |
|---|---|---|
| PATENT NO. | : 8,585,257 B2 | Page 1 of 1 |
| APPLICATION NO. | : 12/809694 | |
| DATED | : November 19, 2013 | |
| INVENTOR(S) | : Thomas Schwarz et al. | |

It is certified that error appears in the above-identified patent and that said Letters Patent is hereby corrected as shown below:

In the Claims

Col. 10, Lines 25-28, please correct claim 7 of said Letters Patent as follows:

7. The compact housing according to claim 1, wherein a moisture trap is located in the enclosed volume; and wherein the moisture trap contains one of a hydrophilic substance and is formed as a cold trap.

Signed and Sealed this
Twenty-eighth Day of April, 2015

Michelle K. Lee
*Director of the United States Patent and Trademark Office*